(12) United States Patent
Fahim

(10) Patent No.: US 9,971,378 B1
(45) Date of Patent: May 15, 2018

(54) METHOD AND DEVICE FOR HIGH-SPEED SUB-PICOSECOND LINEAR CLOCK PHASE DETECTION

(71) Applicant: INPHI CORPORATION, Santa Clara, CA (US)

(72) Inventor: Amr Fahim, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days. days.

(21) Appl. No.: 15/659,502

(22) Filed: Jul. 25, 2017

(51) Int. Cl.
*H03K 3/017* (2006.01)
*G06F 1/10* (2006.01)
*H03L 7/087* (2006.01)
*G06F 1/08* (2006.01)
*H03L 7/081* (2006.01)
*H03K 21/02* (2006.01)

(52) U.S. Cl.
CPC .................. *G06F 1/10* (2013.01); *G06F 1/08* (2013.01); *H03K 21/026* (2013.01); *H03L 7/081* (2013.01); *H03L 7/087* (2013.01)

(58) Field of Classification Search
CPC  G06F 1/10; G06F 1/08; H03K 21/026; H03L 7/081; H03L 7/087
USPC .................................. 327/291, 2–3, 147–160
See application file for complete search history.

(56) References Cited

U.S. PATENT DOCUMENTS

| 7,414,449 B2* | 8/2008 | Russell | H03K 3/356156 327/199 |
| 7,571,359 B2* | 8/2009 | Gutnik | G06F 1/10 714/700 |
| 8,704,553 B2* | 4/2014 | Pun | H03F 3/45071 327/55 |

* cited by examiner

*Primary Examiner* — Dinh T Le
(74) *Attorney, Agent, or Firm* — Richard T. Ogawa; Ogawa P.C.

(57) ABSTRACT

A clock phase detector circuit device and method. The device can include a first and second clock inputs connected to two pairs of transistors, each transistor having a first, second, and third terminal. The first pair includes a p-type transistor and n-type transistor configured such that the third terminals of each transistor are connected to form a first output node. Similarly, the second pair includes a p-type transistor and n-type transistor, the second p-type transistor and n-type transistor configured such that the third terminals of each transistor are connected to form a second output node. The first clock input is connected to the first terminals of the first p-type transistor and the second n-type transistor, while the second clock input is connected to the first terminals of the second p-type transistor and the first n-type transistor. As configured, the voltage outputs represent the phase difference between the clock inputs.

20 Claims, 6 Drawing Sheets

METHOD AND DEVICE FOR HIGH-SPEED SUB-PICOSECOND LINEAR CLOCK PHASE DETECTION

CROSS-REFERENCES TO RELATED APPLICATIONS

N/A

BACKGROUND OF THE INVENTION

The present invention relates to communication systems and integrated circuit (IC) devices. More particularly, the present invention provides for improved methods and devices for clock phase detection.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

An important aspect of communication systems involves high-speed clock routing. High speed clock routing usually involves routing differential signals through several buffers before reaching a target destination, such as a flip-flop, mixer, or data converter. In many applications, precise control of the skew between positive and negative terminals of a differential clock is critical as it may introduce timing errors or reduce timing margins in the data path.

With control over skew being a necessity, phase detectors are an integral component of any feedback timing circuit, such as phase-locked loops (PLLs) or delay locked loops (DLLs). These detectors measure the phase difference between two input clocks, which in turn is used as a feedback signal to control the differential phase adjustment of the input clocks. Although there are several types of devices and methods related to clock phase detection, they have been inadequate for the advancement of various applications. Therefore, improved methods of clock phase detection are highly desired.

BRIEF SUMMARY OF THE INVENTION

The present invention relates to communication systems and integrated circuit (IC) devices. More particularly, the present invention provides for improved methods and devices for clock phase detection.

In an example, the present invention provides a clock phase detector circuit device. The device can include a first and a second clock inputs connected to a circuit configuration with two pairs of transistors, each transistor having a first, second, and third terminal. The first transistor pair includes a first p-type transistor and n-type transistor configured such that the third terminals of each transistor are connected to form a first output node. Similarly, the second transistor pair includes a second p-type transistor and n-type transistor, the second p-type transistor and n-type transistor configured such that the third terminals of each transistor are connected to form a second output node. The first clock input is connected to the first terminals of the first p-type transistor and the second n-type transistor, while the second clock input is connected to the first terminals of the second p-type transistor and the first n-type transistor. The second terminals of the first and second p-type transistors are connected to a voltage supply, while the second terminals of the first and second n-type transistors are connected to ground. Configured in this manner, the first and second output nodes output a voltage representing a phase difference between the first and second clock inputs.

In an example, the present invention provides a method of phase detection using a phase detector as described above. Generally, the phase detector will detect if there is no skew, a positive skew, or a negative skew between two clock inputs. These inputs can be arbitrary clock signals or a pair of differential clock inputs. In the case of no skew, the output voltage at the first output node is equal to the output voltage of the second output node. For positive skew, the output voltage at the first output node is greater than the output voltage for the second output node. For negative skew, the voltage output at the second output node is greater than the output voltage at the first output node. With low-pass filters connected to each of the output nodes, the relative charging and discharging times at each output node can be compared to determine if there is any skew present.

Many benefits are recognized through various embodiments of the present invention. Such benefits include improved timing margins in a data path and improved control over skew between two clock inputs, which can be positive and negative terminals of a differential clock or any two arbitrary clock signals. The present invention outperforms conventional designs by achieving sub-picosecond accuracy over process, voltage, and temperature variation (PVT) and random mismatch. Other benefits will be recognized by those of ordinary skill in the art.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention the presently described embodiments and the presently understood best mode of the invention are described with additional detail through the use of the accompanying drawings in which.

DETAILED DESCRIPTION OF THE INVENTION

Figure 1:
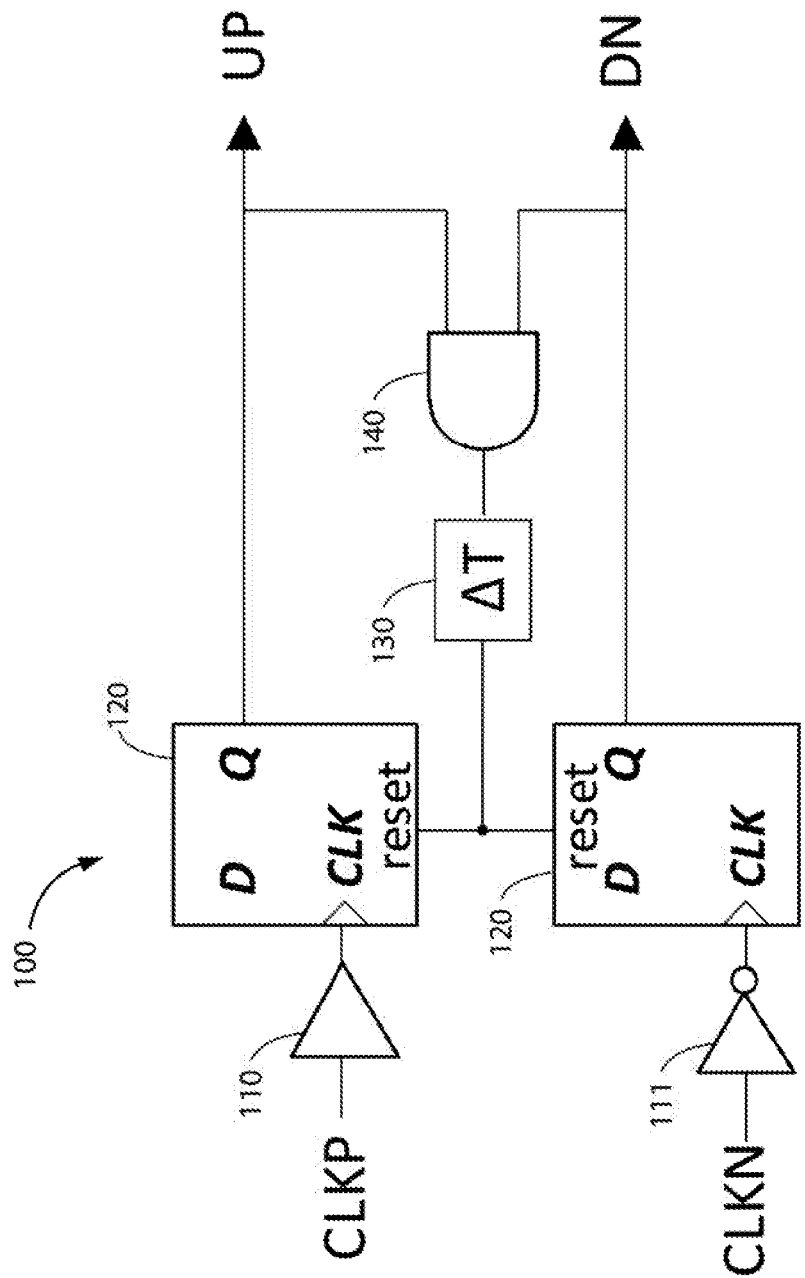
FIG. 1 is a simplified circuit block diagram of a 3-state-clock phase detector according to a conventional example.

The present invention relates to communication systems and integrated circuit (IC) devices. More particularly, the present invention provides for improved methods and devices for clock phase detection.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

High speed clock routing usually involves routing differential signals through several buffers before reaching a target destination, such as a flip-flop, mixer, or data converter. In many applications, precise control of the skew between positive and negative terminals of a differential clock is critical as it may introduce timing errors or reduce timing margins in the data path. Such issues are addressed by the embodiments of the present invention described below.

FIG. 1 is a simplified circuit block diagram of a 3-state differential clock phase detector according to a conventional example of a 3-state phase detector. As shown, device 100 includes two D-type flip-flops 120, each with an input, an output, and a reset terminal. The CLKP signal is fed through a buffer 110 to the input of the first flip-flop 120, while the CLKN signal is fed through an inverter 111 to the input of the second flip-flop 120. The outputs of each flip-flop 120 are coupled to an AND gate 140, the output of which is fed through a delay block to the reset terminals of both flip-flops 120.

This type of phase detector is often used in PLLs with reference to frequencies below 1 GHz. This phase detector can be used to detect the skew between positive and negative edges of a clock by inverting the CLKN input by inverter 111 and delay balancing the CLKP input by buffer 110.

However, this type of phase detector suffers from limited frequency and accuracy. The frequency of operation is limited by the required reset feedback delay required to properly reset the flip-flops and the amount of time required for the succeeding circuitry to react to the phase detector output and settle. The accuracy is limited by random mismatches of the transistors used to implement to the phase detector and inaccurate delay balancing between the differential clocks (prior to the flip-flops) due to the delay differences between inverter 111 and buffer 110. In fact, the delay balancing error alone can easily exceed a picosecond.

Figure 2:
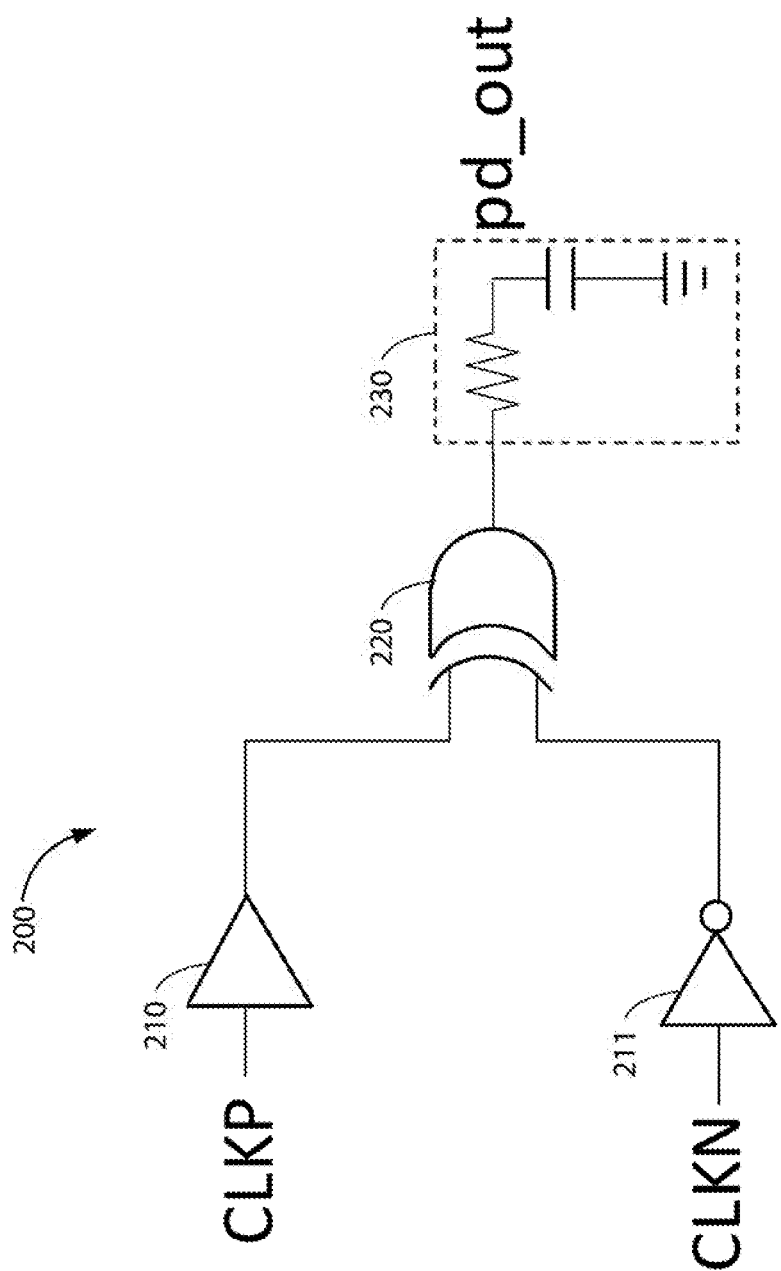
FIG. 2 is a simplified circuit block diagram of a linearclock phase detector according to a conventional example.

FIG. 2 is a simplified circuit block diagram of a linear differential clock phase detector according to a conventional example. As shown in device 200, the CLKP signal is fed through a buffer 210 while the CLKN signal is fed through an inverter 211. The resulting output signals are coupled to an XOR gate 220, the output (pd out) of which is coupled to a low-pass filter 230. Here, the phase detector inverts the CLKN input while delay balancing the CLKP input. For modern CMOS technologies, this phase detector can operate at clock frequencies as high as several GHz. Since the output of the phase detector is an analog signal, which is low-pass filtered, output rail-to-rail operation is not necessary. This enables use of larger device sizes to reduce device random mismatch and improve the accuracy of the phase detector. However, this phase detector also suffers from the same delay mismatch described for the 3-state phase detector (FIG. 1) between the delay element and the inverter at the input.

In an example, the present invention provides a clock phase detector circuit device to overcome the limitations of conventional detectors, such as those shown in FIGS. 1 and 2. The device can include a first and a second clock inputs connected to a circuit configuration with two pairs of transistors, each transistor having a first, second, and third terminal. The first transistor pair includes a first p-type transistor and n-type transistor configured such that the third terminals of each transistor are connected to form a first output node. Similarly, the second transistor pair includes a second p-type transistor and n-type transistor, the second p-type transistor and n-type transistor configured such that the third terminals of each transistor are connected to form a second output node. The first clock input is connected to the first terminals of the first p-type transistor and the second n-type transistor, while the second clock input is connected to the first terminals of the second p-type transistor and the first n-type transistor. The second terminals of the first and second p-type transistors are connected to a voltage supply, while the second terminals of the first and second n-type transistors are connected to ground. Configured in this manner, the first and second output nodes output a voltage representing a phase difference between the first and second clock inputs.

In an example, the present invention provides a method of phase detection using a phase detector as described above. Generally, the phase detector will detect if there is no skew, a positive skew, or a negative skew between two clock inputs. These inputs can be arbitrary clock signals or a pair of differential clock inputs. In the case of no skew, the output voltage at the first output node is equal to the output voltage of the second output node. For positive skew, the output voltage at the first output node is greater than the output voltage for the second output node. For negative skew, the voltage output at the second output node is greater than the output voltage at the first output node.

In an example, the phase detector circuit device can further comprise a first low-pass filter connected to the first output node and a second low-pass filter connected to the second output node. With low-pass filters connected to each of the output nodes, the relative charging and discharging times at each output node can be compared to determine if there is any skew present.

In an example, the phase detector can be connected to additional analog or digital circuit modules. The analog circuit modules can include all sorts of active and passive components, such as integrators, filters, multipliers, delay lines, and the like. Some specific examples may use one or more higher order low-pass filters or active-C integrators. The digital circuit modules include an analog-to-digital converter (ADC), which can be connected to a digital-to-analog converter (DAC), a bank of inverters, a digitally-controlled delay line, and the like. The present device can be configured in a delay-locked loop (DLL), a phase-locked loop (PLL), a carrier and data recovery (CDR) configuration, and others. Those of ordinary skill in the art will recognize other variations, modifications, and alternatives.

Figure 3:
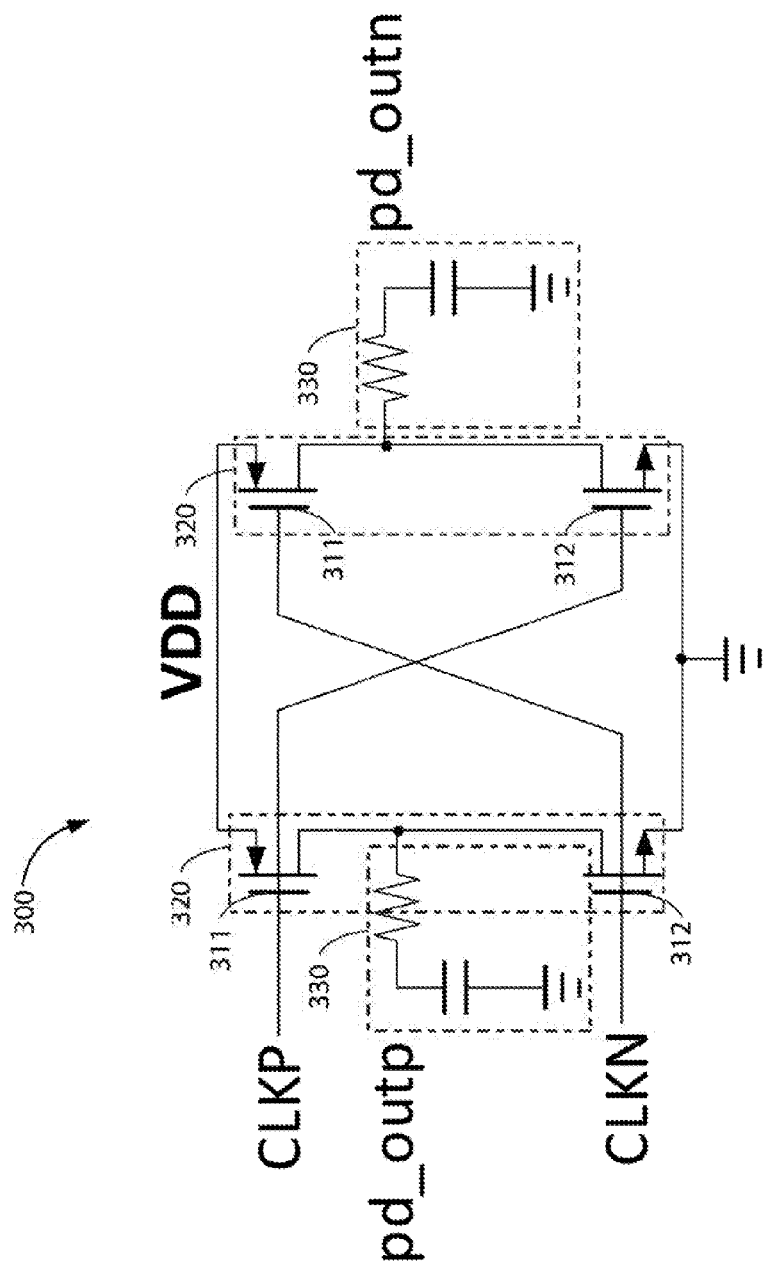
FIG. 3 is a simplified circuit block diagram of a clock phase detector according to an example of the present invention.

FIG. 3 is a simplified circuit block diagram of a differential clock phase detector according to an example of the present invention. As shown, device 300 includes two transistor pairs 320. In an example, each transistor pair can include a PFET 311 and an NFET 312, each with gate, drain, and source terminals. These transistor pairs 320 can be configured as follows: the source terminals of the PFETs 311 are connected to a supply source VDD, the drain terminals of the PFETs 311 are connected to the drain terminals of the NFETs 312 within each transistor pair 320, the CLKP input is connected to the gate of the PFET in the first transistor pair and the gate of the NFET in the second transistor pair, the CLKN input is connected to the gate terminal of the NFET in the first transistor pair and the gate terminal of the PFET in the second transistor pair, and the source terminals of the NFETs 312 are connected to ground. Low pass filters 330 can be connected to the differential outputs (pd_outp/pd_outn) of this phase detector, similar to that shown in FIG. 2. Here, the output is an analog signal, which can be low-pass filtered by a passive RC filter. With this configuration, no delay element or inverter is required at the input of the phase detector.

When the differential clock signals are precisely 180 degrees apart, both NFET/PFET branches are on equal amounts of time, which means that the RC filters on the pd_outp and pd_outn terminals are being charged and discharged (through the NFET/PFET pairs) in equal amounts of time. Neglecting device mismatches, this means that the differential phase detector voltage outputs (pd_outp/pd_outn) are equal. In the case that the mobilities of the NFET and PFET devices are set as equal, then the resulting voltage is near VDD/2, where VDD is the supply voltage to the phase detector. If there is a skew between the input clocks, then the skew will tilt the differential phase detector output either to negative or positive voltage.

Figures 4A, 4B, 4C:
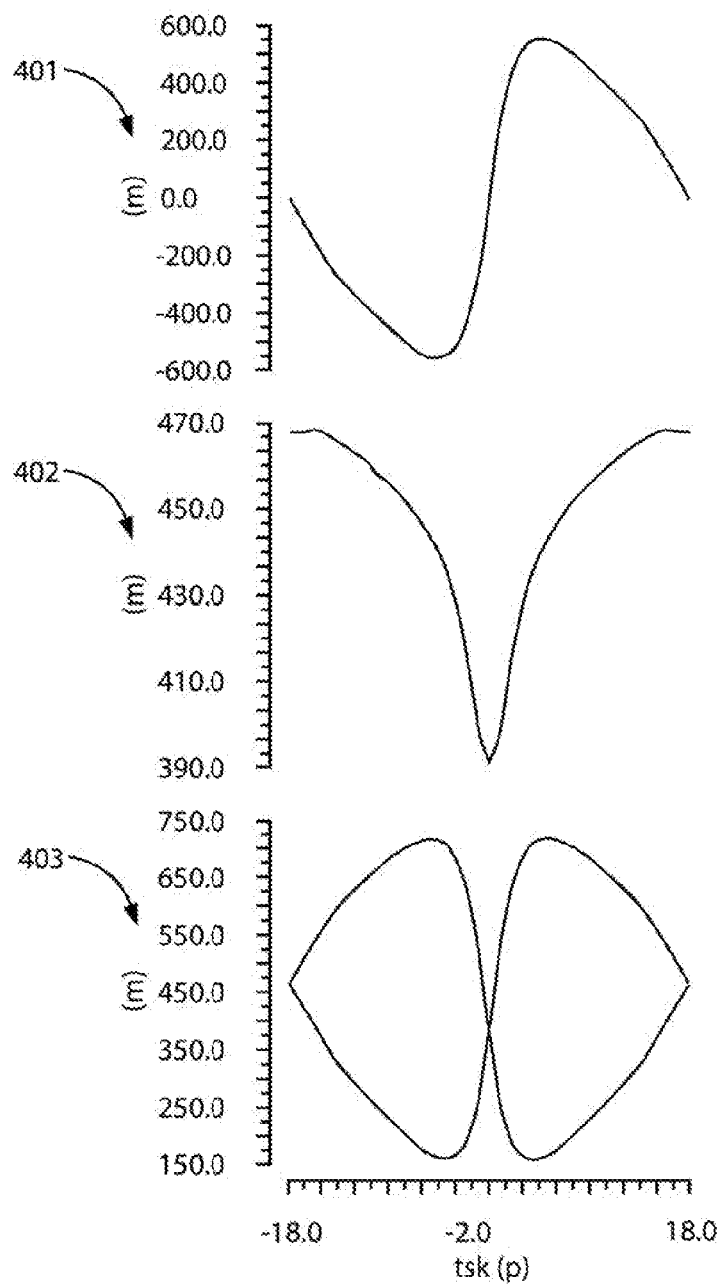
FIGS. 4A to 4C are simplified graphs illustrating voltage curves from a clock phase detector according to an example of the present invention.

FIGS. 4A to 4C are simplified graphs illustrating voltage curves from a differential clock phase detector according to an example of the present invention. The clock period for these phase detector outputs in FIGS. 4A to 4C is 36 ps. The output response is shown over [−18 ps, +18 ps], which is [−π, +ρ], i.e., an entire clock period.

FIG. 4A shows the phase detector output voltage curve. Graph 401 shows that the output is monotonic with a near constant slope over a small range of [−3 ps, +3 ps]. This means that the gain of the phase detector is nearly constant within this range. Although the gain falls off, this level of gain can be sufficient for applications in which only fine control of the differential clock skew is necessary to bring the skew down to sub-picosecond accuracy. Further, the polarity of the phase detector is correct across the entire range of [−18 ps. +18 ps], i.e., one full clock phase. This means that the DLL will function correctly for any arbitrary phase shift between CLKP and CLKN when this phase detector is used in a DLL.

FIG. 4B shows the common mode voltage of the phase detector according to an example of the present invention. The common mode voltage is defined as the average of the "pd_outp" and "pd_outn" voltages. Graph 402 shows that there is a small, undesirable shift in the phase detector common mode; however, this shift is less than 100 mV, which is adequate for most applications.

FIG. 4C shows a single-ended response of both "pd_outp" and "pd_outn", which shows both the differential and common mode output voltage responses.

Figure 5:
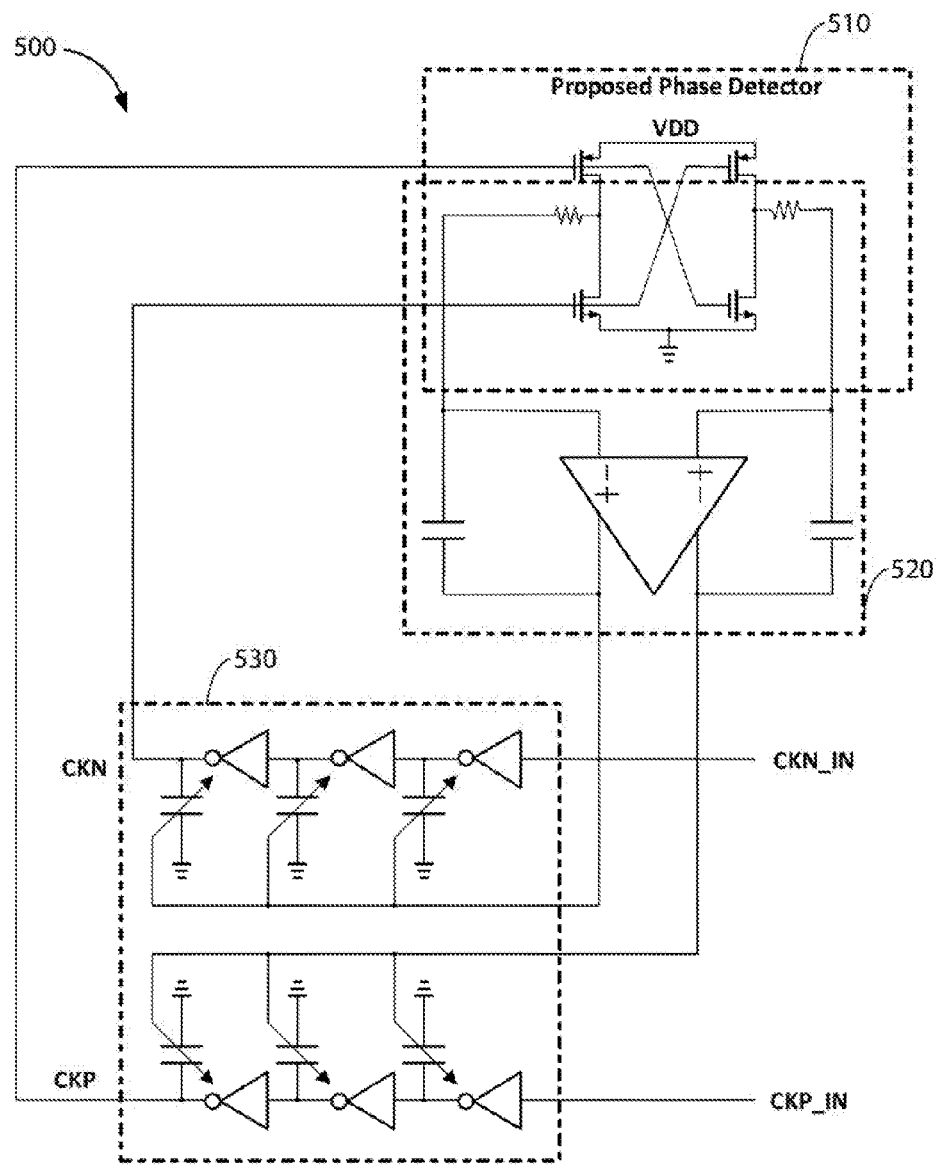
FIG. 5 is a simplified circuit block diagram of a clock phase detector device configured in a delay-locked loop (DLL) according to an example of the present invention.

FIG. 5 is a simplified circuit block diagram of a differential clock phase detector device configured in a delay-locked loop (DLL) according to an example of the present invention. As shown, device 500 includes the phase detector 510 previously shown in FIG. 3. This phase detector 510 is configured in a DLL with an active integrator 520 and a delay line 530.

FIG. 5 shows an example of the present phase detector configured in a DLL to control the skew of a differential clock. This example uses a resistor R and an active-C integrator instead of a passive RC filter to provide larger DC gain and effective capacitance due to the multiplicative effect by the amplifier open loop gain (Miller effect). The output of the amplifier can be used to control varactors along the clock signal to differentially modify the delay.

Figure 6:
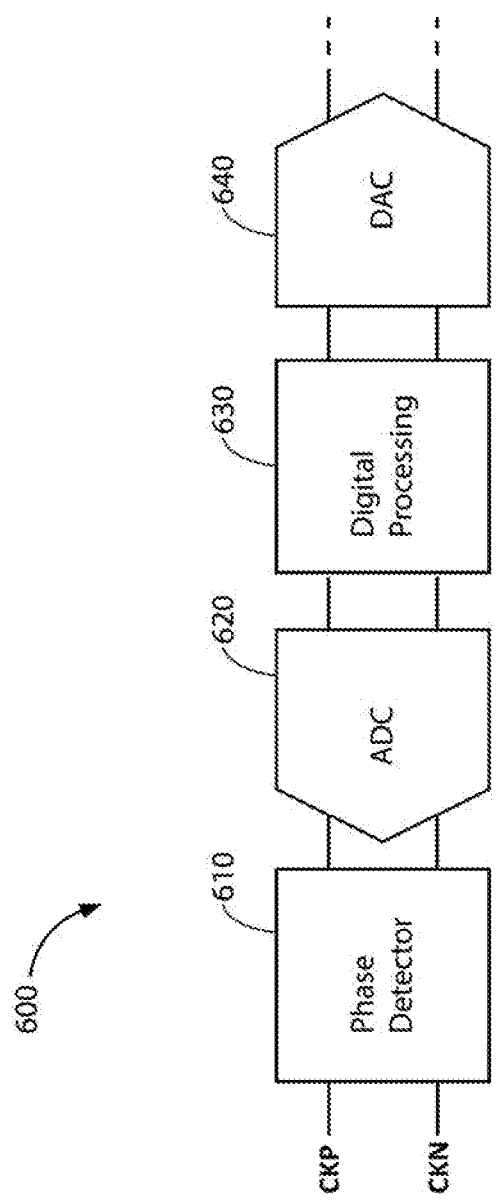
FIG. 6 is a simplified block diagram of a clock phase detector device according to an example of the present invention.

FIG. 6 is a simplified block diagram of a clock phase detector device according to an example of the present invention. As shown, device 600 includes a phase detector 610, an analog-to-digital converter (ADC), a digital processing module 630, and a digital-to-analog converter (DAC) connected in series. The phase detector 610 can be similar to device 300 of FIG. 3. Compared to the analog application of device 500 in FIG. 5, this device 600 takes the phase detector 610 output and converts it via ADC 620 for digital processing in module 630. The processed output can then be converted back via DAC 640 for additional analog applications or output via analog devices. In other examples, the DAC can be replaced other components, such as a bank of inverters configured as a digitally-controlled delay module. Those of ordinary skill in the art will recognize other variations, modifications, and alternatives.

Many benefits are recognized through various embodiments of the present invention. Such benefits include improved timing margins in a data path and improved control over skew between two clock inputs, which can be positive and negative terminals of a differential clock or any two arbitrary clock signals. The present invention outperforms conventional designs by achieving sub-picosecond accuracy over process, voltage, and temperature variation (PVT) and random mismatch. Other benefits will be recognized by those of ordinary skill in the art.

While the above is a full description of the specific examples, various modifications, alternative constructions and equivalents may be used. Therefore, the above description and illustrations should not be taken as limiting the scope of the present invention that is defined by the appended claims.

What is claimed is:

1. A clock phase detector circuit device comprising:
a clock-P input;
a clock-N input;
a first transistor pair including a first PFET and first NFET, the first PFET and first NFET each having a gate terminal, a source terminal, and a drain terminal;
wherein the drain terminal of the first PFET is connected to the drain terminal of the first NFET to form a first output node,
a second transistor pair including a second PFET and second NFET, the second PFET and second NFET each having a gate terminal, a source terminal, and a drain terminal;
wherein the drain terminal of the second PFET is connected to the drain terminal of the second NFET to form a second output node;
wherein the clock-P input is connected to the gate terminals of the first PFET and the gate of the second NFET;
wherein the clock-N input is connected to the gate terminals of the second PFET and the gate of the first NFET;
wherein the source terminals of the first and second PFETs are connected to a voltage supply;
wherein the source terminals of the first and second NFETs are connected to ground; and
wherein the first and second output nodes are configured to output a voltage representing a phase difference between the clock-P and clock-N inputs.

2. The device of claim 1 further comprising a first low-pass filter connected to the first output node and a second low-pass filter connected to the second output node.

3. The device of claim 1 further comprising an active integrator connected the first and second output nodes; and further comprising a delay line connected to each of the clock-P and clock-N inputs.

4. The device of claim 1 further comprising an analog circuit module coupled to the first and second output nodes, wherein the analog circuit module includes an active circuit module, a passive circuit module, an integrator, an active-C integrator, a low-pass filter, one or more higher order low-pass filters, or one or more multipliers.

5. The device of claim 1 further comprising a digital circuit module connected to the first and second output nodes, wherein the digital circuit module includes an analog-to-digital converter (ADC) connected to a digital-to-analog converter (DAC), a bank of inverters, or a digitally-controlled delay line.

6. The device of claim 1 wherein the clock-P input and the clock-N input are differential clock inputs; and wherein the first and second output nodes are configured to output a voltage representing a phase difference between the clock-P and clock-N differential clock inputs.

7. The device of claim 6 further configured in a delay-locked loop (DLL), phase-locked loop (PLL), or carrier and data recovery (CDR) configuration.

8. A clock phase detector circuit device comprising:
a first clock input;
a second clock input;
a first transistor pair including a first p-type transistor and first n-type transistor, the first p-type transistor and first n-type transistor each having a first terminal, a second terminal, and a third terminal;
wherein the third terminal of the first p-type transistor is connected to the third terminal of the first n-type transistor to form a first output node,
a second transistor pair including a second p-type transistor and second n-type transistor, the second p-type transistor and second n-type transistor each having a first terminal, a second terminal, and a third terminal;
wherein the third terminal of the second p-type transistor is connected to the third terminal of the second n-type transistor to form a second output node;
wherein the first clock input is connected to the first terminal of the first p-type transistor and the first terminal of the second n-type transistor;
wherein the second clock input is connected to the first terminal of the second p-type transistor and the first terminal of the first n-type transistor;
wherein the second terminals of the first and second p-type transistors are connected to a voltage supply;
wherein the second terminals of the first and second n-type transistors are connected to ground; and
wherein the first and second output nodes are configured to output a voltage representing a phase difference between the first and second clock inputs.

9. The device of claim 8 wherein the n-type transistors are NFETs and the p-type transistors are PFETs.

10. The device of claim 8 further comprising a first low-pass filter connected to the first output node and a second low-pass filter connected to the second output node.

11. The device of claim 8 further comprising an active integrator connected the first and second output nodes; and further comprising a delay line connected to each of the first and second clock inputs.

12. The device of claim 8 further comprising an analog circuit module coupled to the first and second output nodes, wherein the analog circuit module includes an active circuit module, a passive circuit module, an integrator, an active-C integrator, a low-pass filter, one or more higher order low-pass filters, or one or more multipliers.

13. The device of claim 8 further comprising a digital circuit module coupled to the first and second output nodes, wherein the digital circuit module includes an analog-to-digital converter (ADC) connected to a digital-to-analog converter (DAC), a bank of inverters, or a digitally-controlled delay line.

14. The device of claim 8 further configured in a delay-locked loop (DLL), phase-locked loop (PLL), or carrier and data recovery (CDR) configuration.

15. The device of claim 8 wherein the first clock input and the second clock input are differential clock inputs; and wherein the first and second output nodes are configured to output a voltage representing a phase difference between the first and second differential clock inputs.

16. A method of phase detection between two clocks signal using a phase detector circuit device, the method comprising:
providing the phase detector circuit device having
a first clock input and a second clock input;
a first transistor pair including a first p-type transistor and first n-type transistor, the first p-type transistor and first n-type transistor each having a first terminal, a second terminal, and a third terminal, wherein the third terminal of the first p-type transistor is connected to the third terminal of the first n-type transistor to form a first output node;
a second transistor pair including a second p-type transistor and second n-type transistor, the second p-type transistor and second n-type transistor each having a first terminal, a second terminal, and a third terminal, wherein the third terminal of the second p-type transistor is connected to the third terminal of the second n-type transistor to form a second output node;

wherein the first clock input is connected to the first terminal of the first p-type transistor and the first terminal of the second n-type transistor, wherein the second clock input is connected to the first terminal of the second p-type transistor and the first terminal of the first n-type transistor, wherein the second terminals of the first and second p-type transistors are connected to a voltage supply, and wherein the second terminals of the first and second n-type transistors are connected to ground;

detecting, by the phase detector circuit device, no skew between the first clock input and the second clock input when an output voltage of the first output node is equal to an output voltage of the second output node;

detecting, by the phase detector circuit device, a positive skew between the first clock input and the second clock input when the output voltage at the first output node is greater than the output voltage for the second output node; and detecting, by the phase detector circuit device, a negative skew between the first clock input and the second clock input when the voltage output at the second output node is greater than the output voltage at the first output node.

17. The method of claim 16 wherein the phase detector circuit device further comprises a first low-pass filter connected to the first output node and a second low-pass filter connected to the second output node;

wherein the detecting of no skew occurs when the first low-pass filter and the second low-pass filter charge and discharge in equal amounts of time;

wherein detecting of a positive skew occurs when the first low-pass filter charges and discharges faster than the second low-pass filter; and wherein detecting of a negative skew occurs when the second low-pass filter charges and discharges faster than the first low-pass filter.

18. The method of claim 16 wherein the phase detector circuit device further comprising an active integrator connected the first and second output nodes, wherein the phase detector circuit device further comprises a delay line connected to each of the first and second clock inputs;

further comprising processing, by the active integrator, output voltages at the first output node and second output node; and further comprising modifying, by the delay lines, a delay associated with the output voltages at the first output node and the second output node.

19. The device of claim 16 wherein the first clock input and the second clock input are arbitrary clock inputs; and wherein the first and second output nodes are configured to output a voltage representing a phase difference between the first and second clock inputs.

20. The device of claim 16 wherein the first clock input and the second clock input are differential clock inputs; and wherein the first and second output nodes are configured to output a voltage representing a phase difference between the first and second differential clock inputs.

* * * * *